(12) United States Patent
Yoshino et al.

(10) Patent No.: US 12,131,855 B2
(45) Date of Patent: Oct. 29, 2024

(54) CIRCUIT BOARD PROVIDED WITH COIL COMPONENT

(71) Applicant: TDK Corporation, Tokyo (JP)

(72) Inventors: Hanako Yoshino, Tokyo (JP); Keigo Higashida, Tokyo (JP)

(73) Assignee: TDK Corporation, Tokyo (JP)

( * ) Notice: Subject to any disclaimer, the term of this patent is extended or adjusted under 35 U.S.C. 154(b) by 804 days.

(21) Appl. No.: 17/177,404

(22) Filed: Feb. 17, 2021

(65) Prior Publication Data

US 2021/0257143 A1 Aug. 19, 2021

(30) Foreign Application Priority Data

Feb. 18, 2020 (JP) .................. 2020-025598

(51) Int. Cl.
*H01F 17/04* (2006.01)
*H01F 27/28* (2006.01)
*H01F 27/29* (2006.01)
*H05K 1/11* (2006.01)

(52) U.S. Cl.
CPC ....... *H01F 17/045* (2013.01); *H01F 27/2828* (2013.01); *H01F 27/292* (2013.01); *H05K 1/11* (2013.01)

(58) Field of Classification Search
CPC ... H01F 17/045; H01F 27/2828; H01F 27/292
USPC .......................................... 336/83
See application file for complete search history.

(56) References Cited

U.S. PATENT DOCUMENTS

| 2008/0084254 A1 | 4/2008 | Takahashi et al. |
| 2012/0133469 A1* | 5/2012 | Tomonari .............. H01F 27/292 336/192 |
| 2019/0279815 A1* | 9/2019 | Murakami .............. H01F 27/24 |

FOREIGN PATENT DOCUMENTS

| JP | S6316407 U | * | 2/1988 | |
| JP | 06-310338 A | | 11/1994 | |
| JP | 2000-058343 A | | 2/2000 | |
| JP | 2005347379 A | * | 12/2005 | |
| JP | 2008-140903 A | | 6/2008 | |
| JP | 2009-267596 A | | 11/2009 | |
| JP | 2010010550 A | * | 1/2010 | |
| JP | 2010165863 A | * | 7/2010 | |
| JP | 2011-082463 A | | 4/2011 | |
| JP | 2013062477 A | * | 4/2013 | |
| JP | 5558609 B1 | * | 7/2014 | ............. H01F 17/04 |
| JP | 2022034595 A | * | 3/2022 | ........... H01F 17/045 |

* cited by examiner

*Primary Examiner* — Shawki S Ismail
*Assistant Examiner* — Joselito S. Bisa
(74) *Attorney, Agent, or Firm* — Rimon P.C.

(57) ABSTRACT

Disclosed herein is a circuit board that includes a substrate and a coil component mounted on the substrate. The coil component includes a core and a wire wound around the core. The substrate includes a dielectric and a capacitive electrode capacitively coupled to the wire through the dielectric and supplied with a ground potential.

16 Claims, 10 Drawing Sheets

CIRCUIT BOARD PROVIDED WITH COIL COMPONENT

BACKGROUND OF THE INVENTION

Field of the Invention

The present invention relates to a circuit board provided with a coil component, more particularly, to a circuit board provided with a coil component having a drum-shaped core wound with a wire.

Description of Related Art

As a coil component having a drum-shaped core wound with wire, one described in JP 2011-82463A is known. In the coil component described in JP 2011-82463A, a wire is wound around a winding core part in three layers, and the self-resonant frequency of the coil component is adjusted by the number of turns in each winding layer.

However, the method described in JP 2011-82463A has difficulty in increasing the self-resonant frequency although being successful in reduction thereof. Further, this method cannot obtain sufficient effect in a frequency band exceeding 1 GHz.

SUMMARY

It is therefore an object of the present invention to provide a circuit board provided with a coil component having an increased self-resonant frequency in a wide frequency band.

A circuit board according to an aspect of the present invention includes a substrate and a coil component mounted on the substrate, wherein the coil component includes a core and a wire wound around the core, and the substrate includes a dielectric and a capacitive electrode capacitively coupled to the wire through the dielectric and supplied with a ground potential.

According to the present invention, a capacitive component is added between the wire and the capacitive electrode, so that a capacitive component between turns of the wire (i.e., inter-wire capacitance) is apparently reduced. This can increase the self-resonant frequency of the coil component in a wide frequency band. In addition, the dielectric is provided between the wire and the capacitive electrode, allowing an increase in the capacitive component between the wire and the capacitive electrode.

In the present invention, the core may include a winding core part wound with the wire, a first flange part positioned at one axial end of the winding core part, and a second flange part positioned at the other axial end of the winding core part. The coil component may further include a first terminal electrode provided on the first flange part and connected to one end of the wire and a second terminal electrode provided on the second flange part and connected to the other end of the wire. The substrate may further include a first land pattern connected to the first terminal electrode and a second land pattern connected to the second terminal electrode. The height of the capacitive electrode may be greater than the height of the first and second land patterns, bringing the wire and capacitive electrode close to each other, which allows a larger capacitive component to be added.

In the present invention, the capacitive electrode may include a first capacitive electrode covering the wire in a first direction and a second capacitive electrode covering the wire in a second direction different from the first direction. Thus, the wire is covered with the capacitive electrode in a plurality of directions, allowing a larger capacitance to be added.

A circuit board according to another aspect of the present invention includes a substrate and a coil component mounted on the substrate, wherein the coil component includes a core and a wire wound around the core, the substrate includes a capacitive electrode capacitively coupled to the wire and supplied with a ground potential, and the capacitive electrode includes a first capacitive electrode covering the wire in a first direction and a second capacitive electrode covering the wire in a second direction different from the first direction.

According to the present invention, a capacitive component is added between the wire and the capacitive electrode, so that a capacitive component between turns of the wire (i.e., inter-wire capacitance) is apparently reduced. This can increase the self-resonant frequency of the coil component in a wide frequency band. In addition, the wire is covered with the capacitive electrode in a plurality of directions, allowing a large capacitance to be added.

In the present invention, the capacitive electrode may be a case member mounted on the surface of the substrate, and the coil component may be accommodated in the case member. Thus, it is possible to add a larger capacitance without applying complicated processing to the substrata.

In the present invention, the substrate may have a cavity accommodating at least a part of the coil component, and the capacitive electrode may be provided on the inner wall of the cavity. Thus, it is possible to add a larger capacitive component without using an additional member such as a case member.

According to the present invention, there can be provided a circuit board provided with a coil component having an increased self-resonant frequency in a wide frequency band.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Hereinafter, a preferred embodiment of the present invention will be described in detail with reference to the accompanying drawings.

First Embodiment

Figure 1:
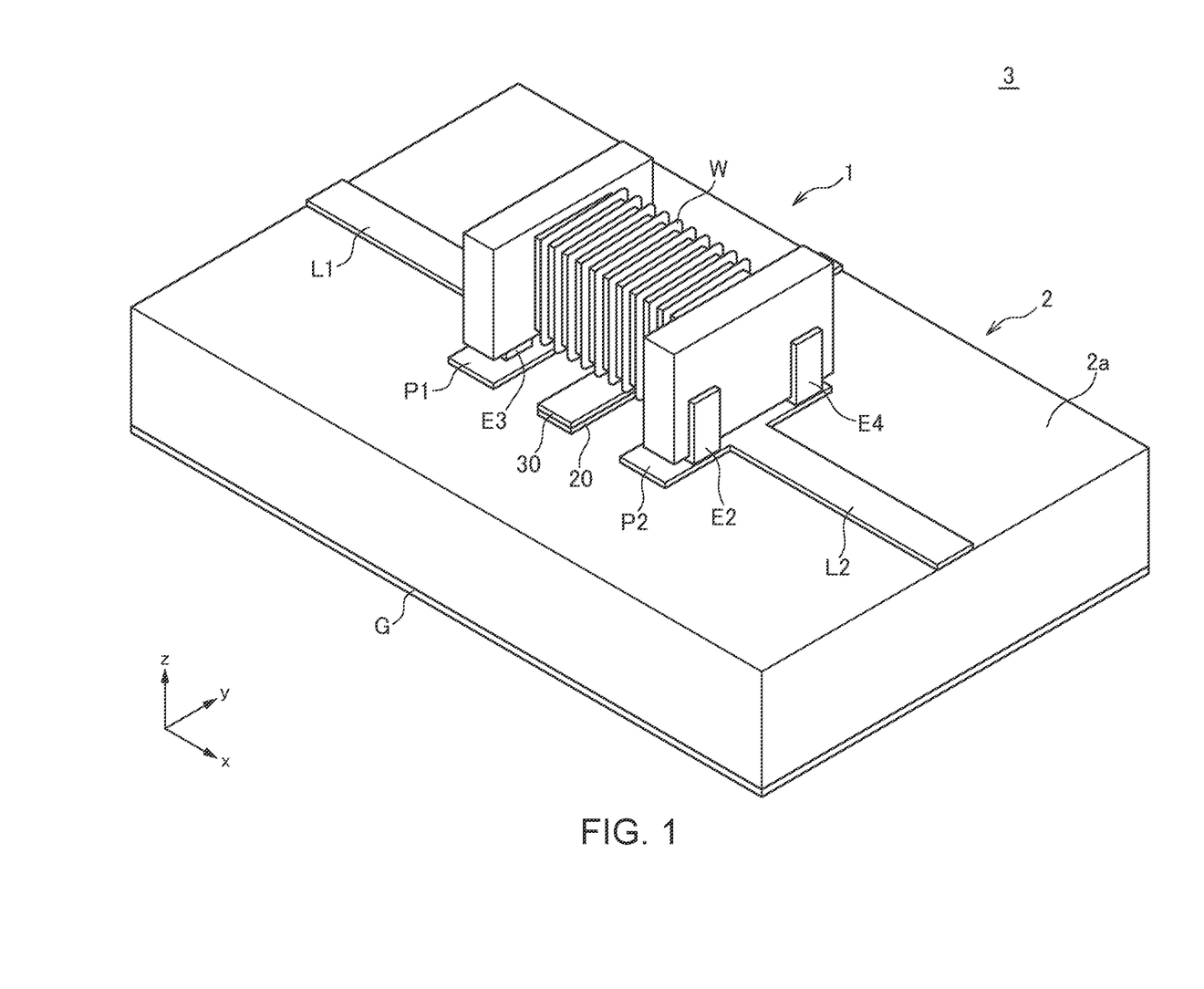
FIG. 1 is a schematic perspective view illustrating the outer appearance of a circuit board 3 according to a first embodiment.

FIG. 1 is a schematic perspective view illustrating the outer appearance of a circuit board 3 according to a first embodiment.

Figure 2:
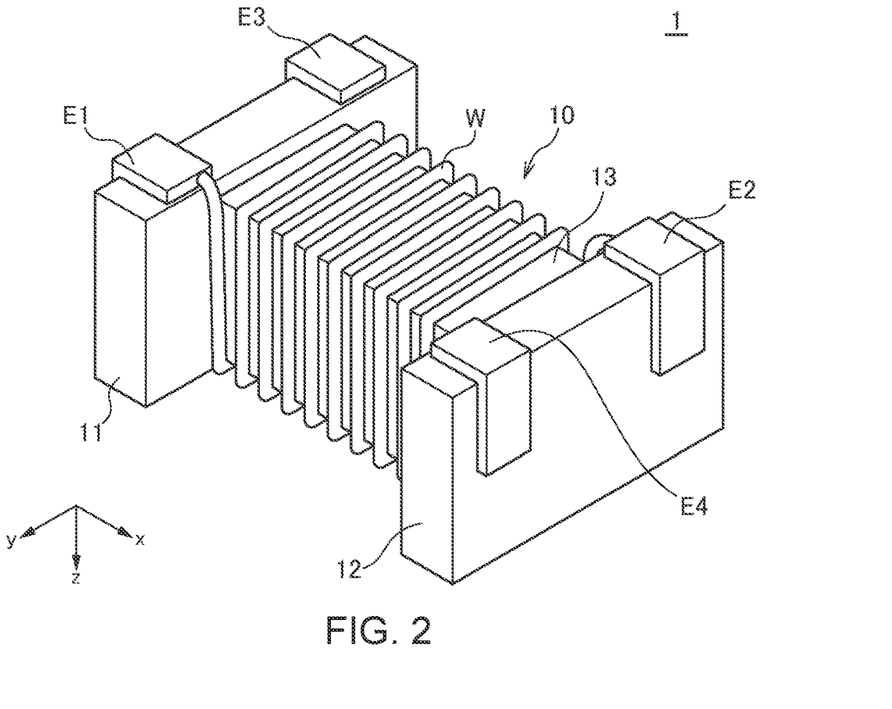
FIG. 2 is a schematic perspective view illustrating the outer appearance of a coil component 1.

As illustrated in FIG. 1, the circuit board 3 according to the first embodiment includes a substrate 2 having a surface 2a and a coil component 1 mounted on the surface 2a. The coil component 1 has a structure illustrated in FIG. 2. As shown in FIG. 2, the coil component 1 includes a drum-shaped core 10, terminal electrodes E1 to E4, and a wire W. The drum-shaped core 10 includes a winding core part 13 whose axis extends in the x-direction, a flange part 11 provided at one end of the winding core part 13 in the x-direction, and a flange part 12 provided at the other end of the winding core part 13 in the x-direction. The drum-shaped core 10 is preferably made of a high permeability material having a permeability μ of 10 H/m to 400 H/m, such as ferrite.

The terminal electrodes E1 and E3 are provided on the flange part 11, and the terminal electrodes E2 and E4 are provided on the flange part 12. The terminal electrodes E1 to E4 may each be a terminal fitting or a conductive paste applied onto the surfaces of the flange parts 11 and 12. The wire W is wound around the winding core part 13 so as to be connected at one end to the terminal electrode E1 and at the other end to the terminal electrode E2. The terminal electrodes E3 and E4 may be omitted or may be used as a dummy terminal for enhancing mounting strength. The terminal electrodes E1 and E3 may be integrally formed; similarly, the terminal electrodes E2 and E4 may be integrally formed.

Figure 3:
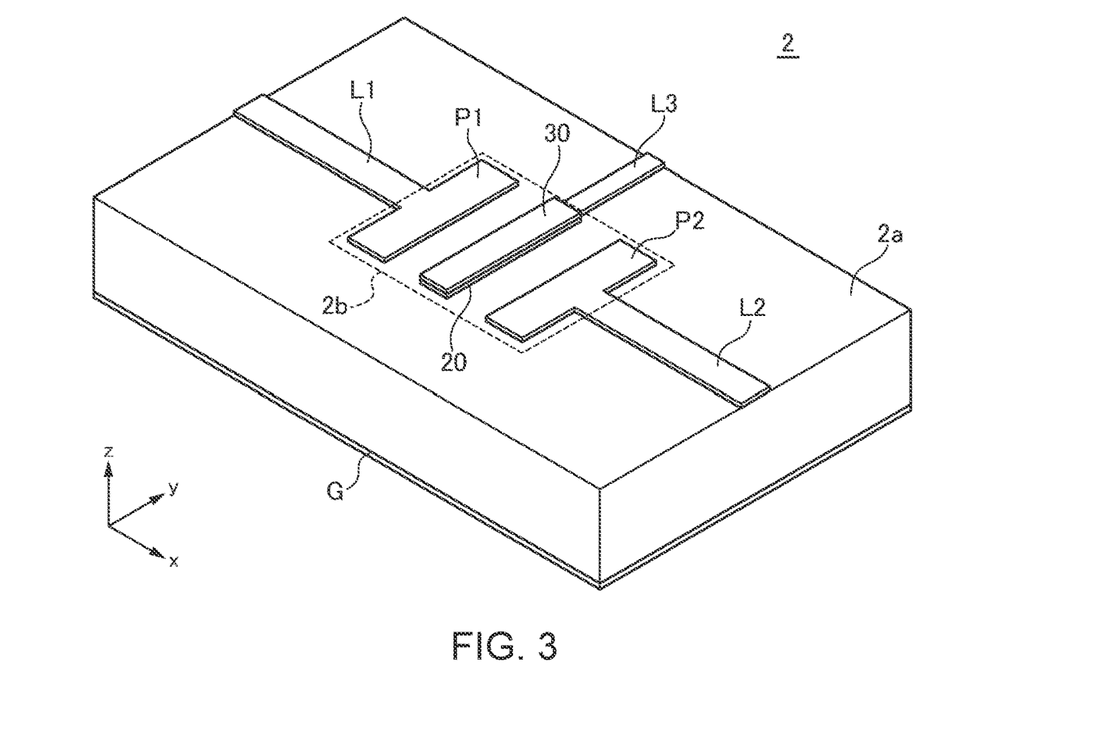
FIG. 3 is a schematic perspective view of the substrate 2 on which the coil component 1 is mounted.

FIG. 3 is a schematic perspective view of the substrate 2 on which the coil component 1 is mounted.

As illustrated in FIG. 3, the substrate 2 has, on the surface 2a, a mounting area 2b in which the coil component 1 is mounted. Land patterns P1 and P2 are provided within the mounting area 2b. When the coil component 1 is mounted in the mounting area 2b, the terminal electrodes E1 and E3 are connected to the land pattern P1, and the terminal electrodes E2 and E4 are connected to the land pattern P2. Further, a capacitive electrode 20 is provided within the mounting area 2b. The surface of the capacitive electrode 20 is covered with a dielectric 30. Thus, as illustrated in a cross-sectional view of FIG. 4, when the coil component 1 is mounted in the mounting area 2b, the capacitive electrode 20 overlaps the wire W through the dielectric 30 to be capacitively coupled to the wire W. The connection between the land pattern P1 and the terminal electrodes E1, E3 and the connection between the land pattern P2 and the terminal electrodes E2, E4 are made through a solder 40. A space S is provided between the wire W and the dielectric 30 so as to prevent interference therebetween.

The land patterns P1 and P2 are connected to wiring patterns L1 and L2, respectively. The wiring patterns L1 and L2 constitute a pair of input/output lines and connected to the coil component 1 through the wire W of the coil component 1. The capacitive electrode 20 is connected to a wiring pattern L3. The wiring pattern L3 is a ground pattern supplied with a ground potential GND.

Figure 5:
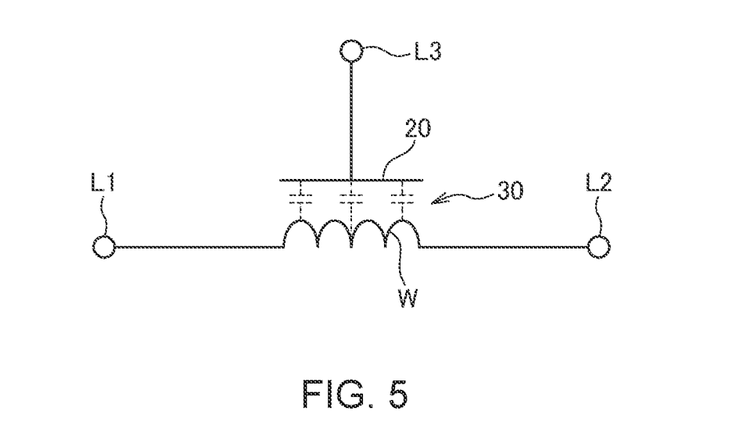
FIG. 5 is an equivalent circuit diagram of the circuit board 3.

FIG. 5 is an equivalent circuit diagram of the circuit board 3 according to the present embodiment.

As illustrated in FIG. 5, in the circuit board 3 according to the present embodiment, the wire W functioning as a coil is connected between the wiring patterns L1 and L2, and a capacitive component is added between the wire W and the capacitive electrode 20. The amount of capacitive component to be added can be adjusted depending on a condition such as the area of the capacitive electrode 20, the thickness and dielectric constant of the dielectric 30, or the size of the space S. Adding such a capacitive component reduces the influence that a capacitive component generated between adjacent turns of the wire W (i.e., inter-wire capacitance) has on the self-resonant frequency, with the result that the self-resonant frequency increases. This means an apparent reduction in the inter-wire capacitance. Such an effect can be obtained even in a frequency band exceeding 1 GHz.

Figure 4:
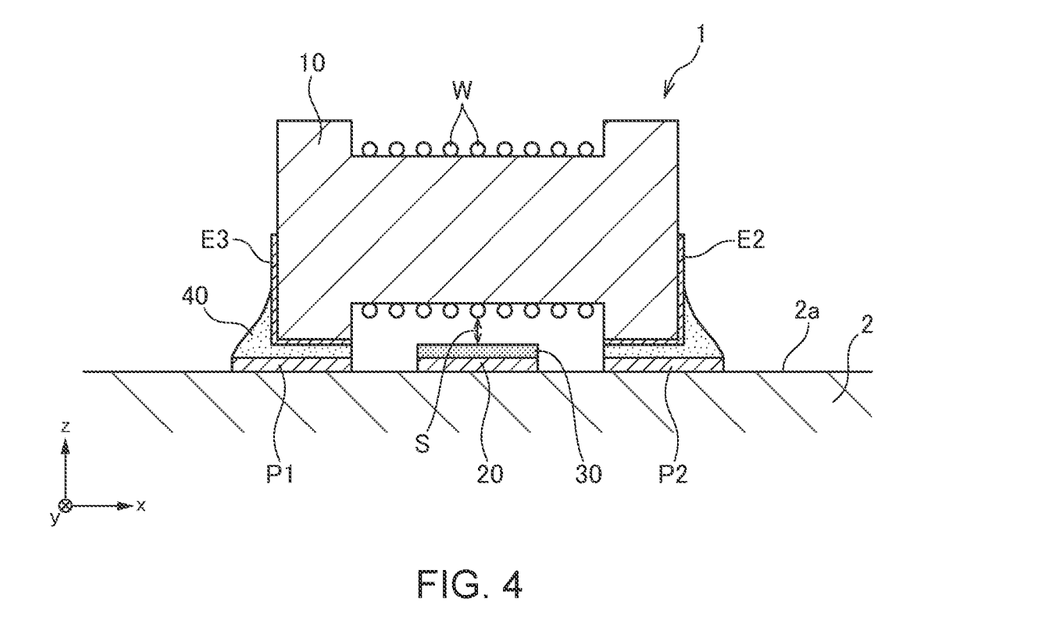
FIG. 4 is a schematic sectional view of the circuit board 3.

As described above, in the circuit board 3 according to the present embodiment, the capacitive electrode 20 supplied with the ground potential GND is provided in the mounting area 2b of the substrate 2, so that when the coil component 1 is mounted on the substrate 2, a capacitive component is added between the wire W and the capacitive electrode 20. Thus, it is possible to make the self-resonant frequency higher than that calculated from an actual inter-wire capacitance without involving a design change of the coil component 1. In addition, since the capacitive electrode 20 is covered with the dielectric 30, it is possible to add a larger capacitive component and to prevent a short failure between the wire W and the capacitive electrode 20.

Figure 6:
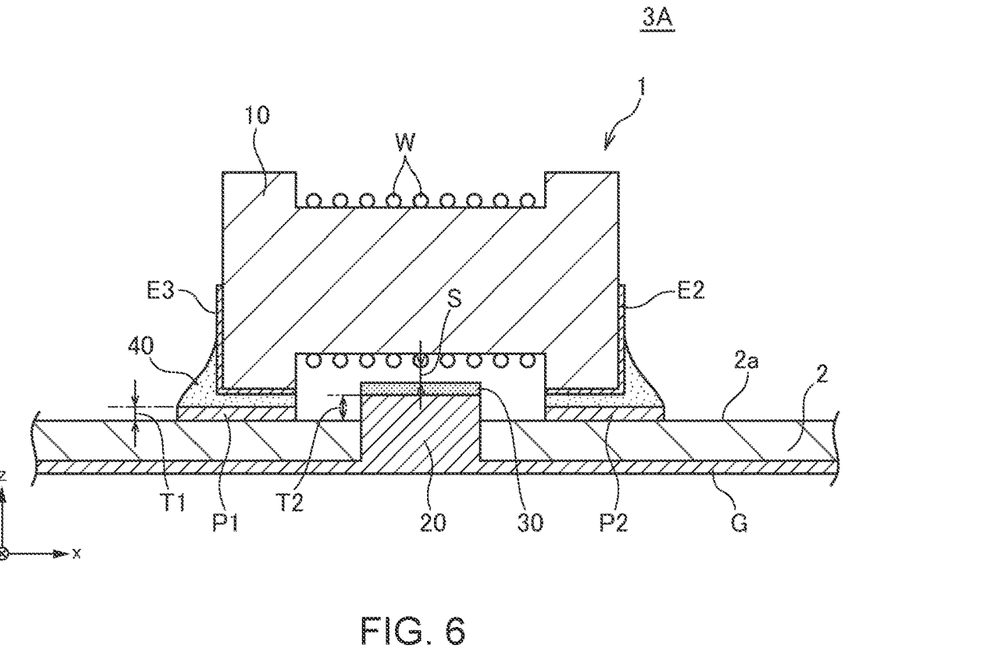
FIG. 6 is a schematic cross-sectional view for explaining the structure of a circuit board 3A according to a first modification.

FIG. 6 is a schematic cross-sectional view for explaining the structure of a circuit board 3A according to a first modification.

The circuit board 3A according to the first modification illustrated in FIG. 6 differs from the circuit board 3 according to the first embodiment in that a height T2 of the capacitive electrode 20 with respect to the surface 2a of the substrate 2 is greater than a height T1 of the land patterns P1 and P2 with respect to the surface 2a of the substrate 2. The back surface of the substrate 2 is covered with a ground pattern G, and the capacitive electrode 20 is constituted by a post conductor penetrating the substrate 2 to be connected to the ground pattern G. Other basic configurations are the same as those of the circuit board 3 according to the first embodiment, so the same reference numerals are given to the same elements, and overlapping description will be omitted.

In the first modification, the height T2 of the capacitive electrode 20 is greater than the height T1 of the land patterns P1 and P2, so that the capacitive electrode 20 can be brought closer to the wire W, which means a reduction in the size of the space S. This allows a larger capacitive component to be added. However, when the height T2 of the capacitive electrode 20 is excessively great, the wire W and the capacitive electrode 20 are brought too close to each other, which may cause a high-frequency short circuit depending on a frequency band to be used. Thus, considering a frequency band to be used, the distance between the wire W and the capacitive electrode 20 is preferably designed so as not to cause the high-frequency short circuit.

Figure 7:
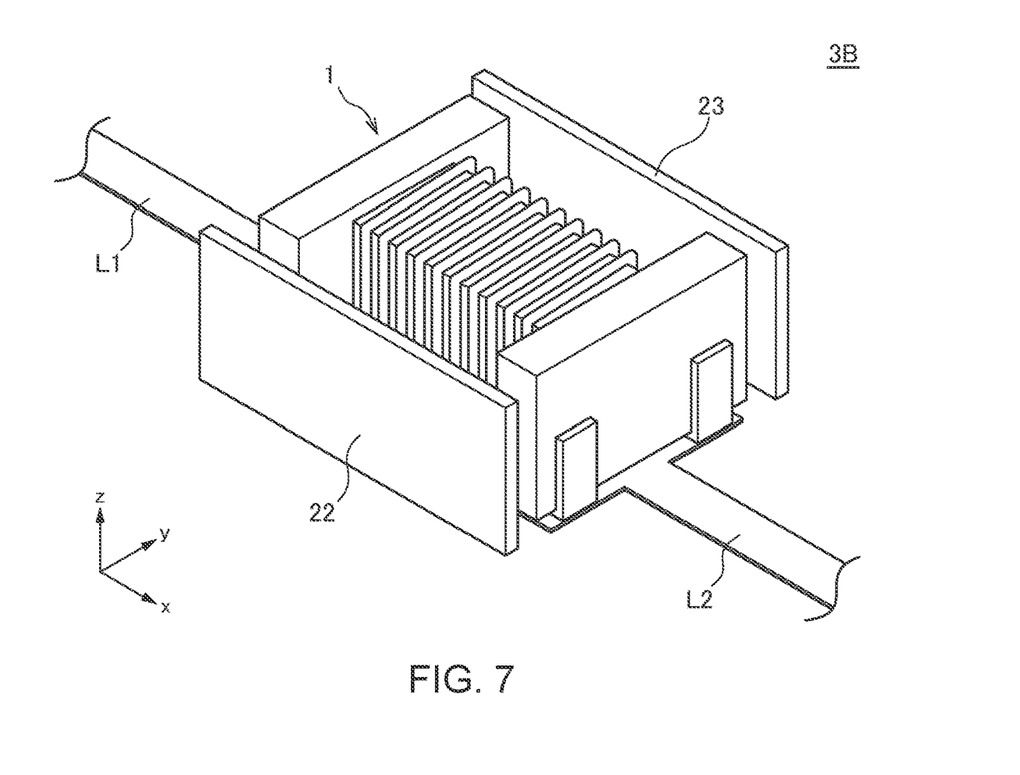
FIG. 7 is a schematic perspective view illustrating the outer appearance of a circuit board 3B according to a second modification.
Figure 8:
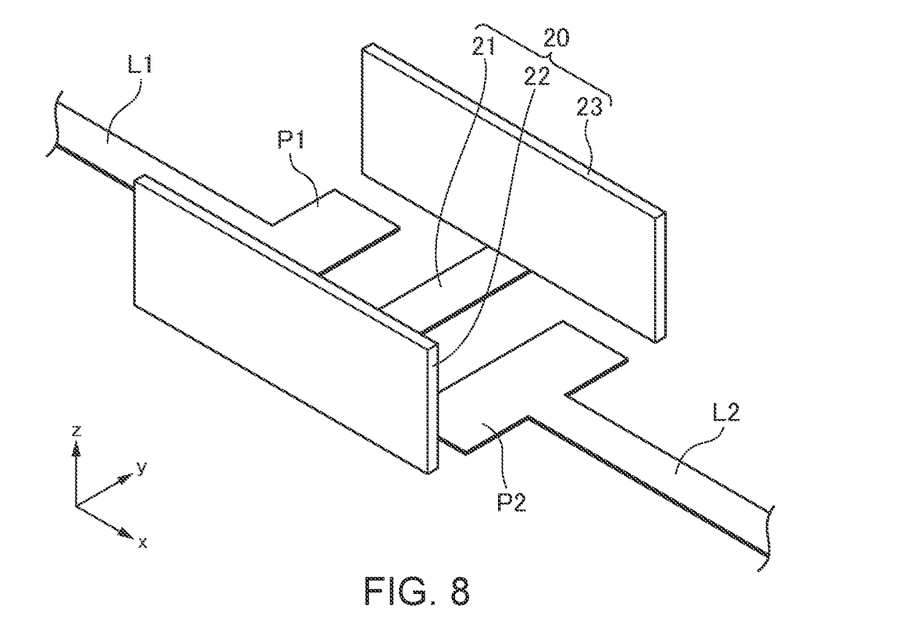
FIGS. 8 and 9 are respectively a schematic perspective view and a schematic plan view illustrating the circuit board 3B from which the coil component 1 has been removed.
Figure 9:
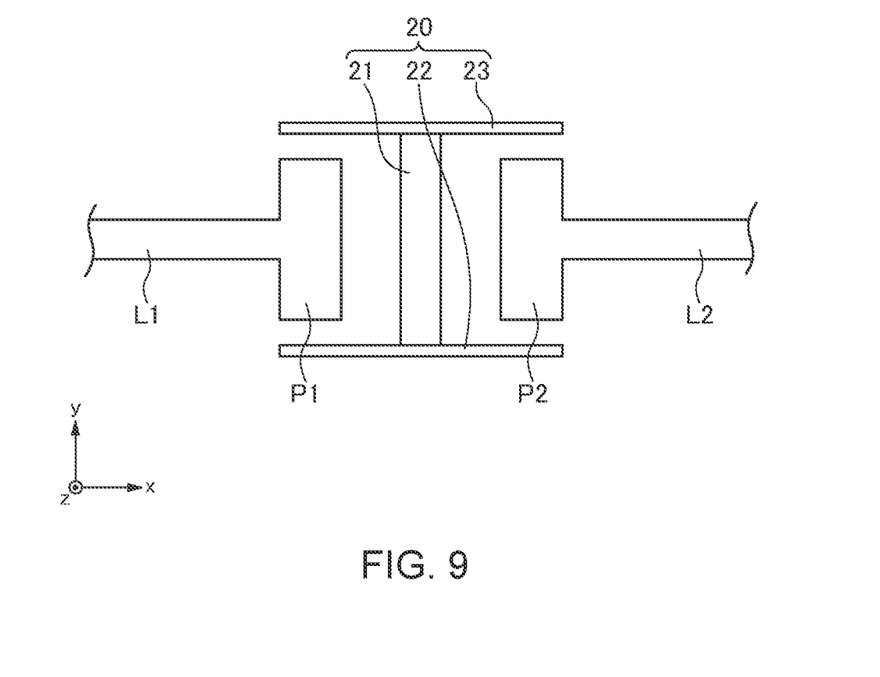

FIG. 7 is a schematic perspective view illustrating the outer appearance of a circuit board 3B according to a second modification. FIGS. 8 and 9 are respectively a schematic perspective view and a schematic plan view illustrating the circuit board 3B from which the coil component 1 has been removed.

The circuit board 3B according to the second modification illustrated in FIGS. 7 to 9 differs from the circuit board 3 according to the first embodiment in that the capacitive electrode 20 is constituted of three capacitive electrodes 21 to 23. Other basic configurations are the same as those of the circuit board 3 according to the first embodiment, so the same reference numerals are given to the same elements, and overlapping description will be omitted.

The capacitive electrode 21 constitutes the xy plane and overlaps the wire W in the z-direction, once the coil component 1 is mounted. The capacitive electrodes 22 and 23 constitute the xz plane and overlap the wire W in the y-direction, once the coil component 1 is mounted. Thus, the wire W and the capacitive electrode 20 overlap each other in three directions, allowing a larger capacitive component to be added. In particular, when the planar size of the coil component 1 is small, it is difficult to add a sufficient capacitive component only with the capacitive electrode 21 constituting the xy plane; however, according to the present modification, a sufficient capacitive component can be added even when the planar size of the coil component 1 is small.

Figure 10:
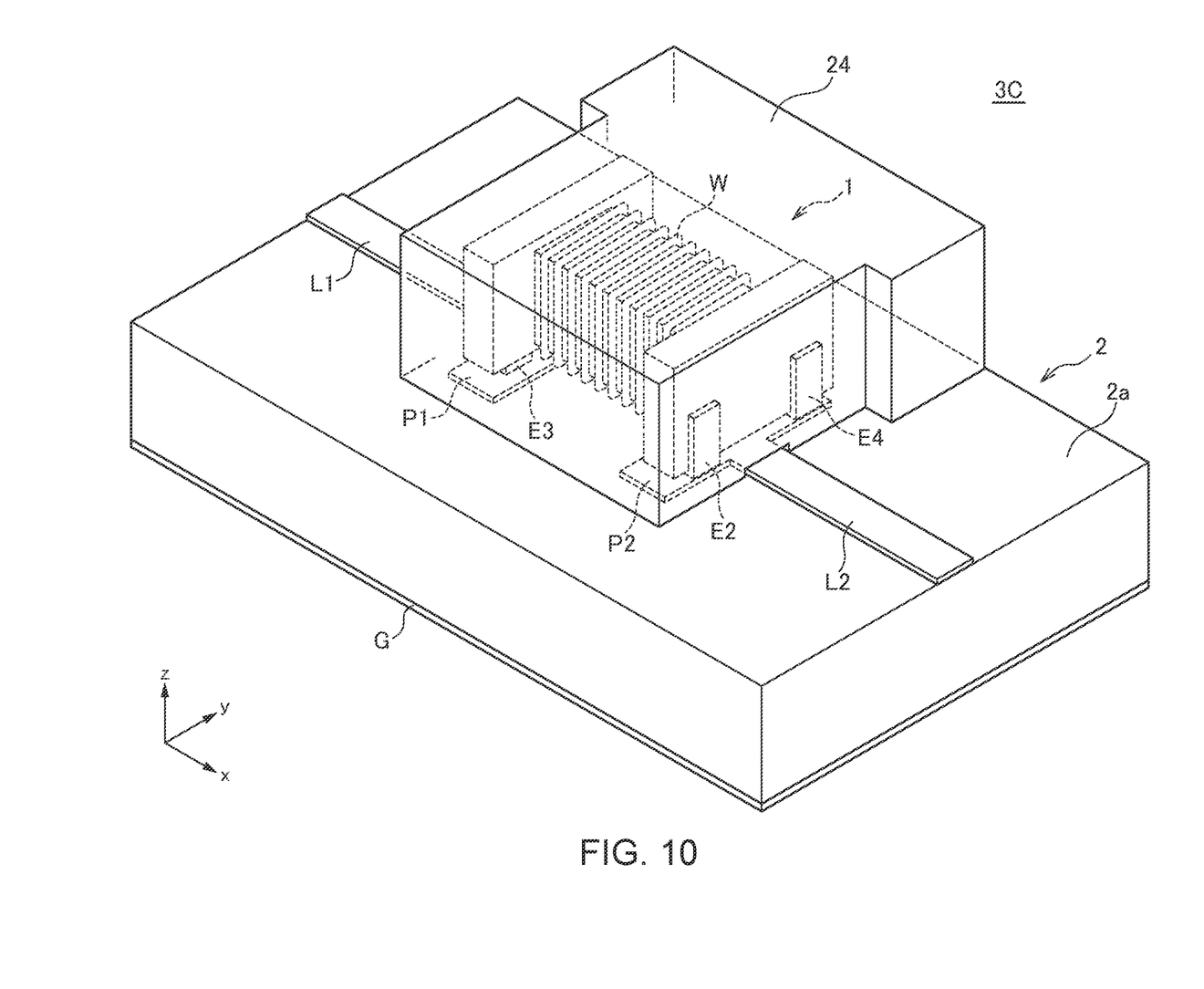
FIG. 10 is a schematic transparent perspective view illustrating the outer appearance of a circuit board 3C according to a third modification.

FIG. 10 is a schematic transparent perspective view illustrating the outer appearance of a circuit board 3C according to a third modification.

The circuit board 3C according to the third modification illustrated in FIG. 10 differs from the circuit board 3 according to the first embodiment in that it has a capacitive electrode 24 formed of a case member. Other basic configurations are the same as those of the circuit board 3 according to the first embodiment, so the same reference numerals are given to the same elements, and overlapping description will be omitted. The capacitive electrode 24 is a metal case member and accommodates therein the coil component 1. The capacitive electrode 24 is supplied with the ground potential GND. Thus, the capacitive electrode 24 and the wire W are capacitively coupled to each other even when a metal case member is used as the capacitive electrode 24, allowing the self-resonant frequency to be adjusted.

However, when the case-shaped capacitive electrode 24 is connected to the ground pattern at a plurality of points, the ground pattern including the capacitive electrode 24 forms a loop. In this case, the capacitive electrode 24 and ground pattern function as a coil, significantly reducing the inductance. To prevent this, the capacitive electrode 24 and ground pattern are preferably connected at one point. Further, the capacitive electrode 24 itself is preferably designed so as not to form a loop. For example, an opening is formed in a part of the capacitive electrode 24, or a part of the capacitive electrode 24 is made of a non-conductive material.

Figure 11:
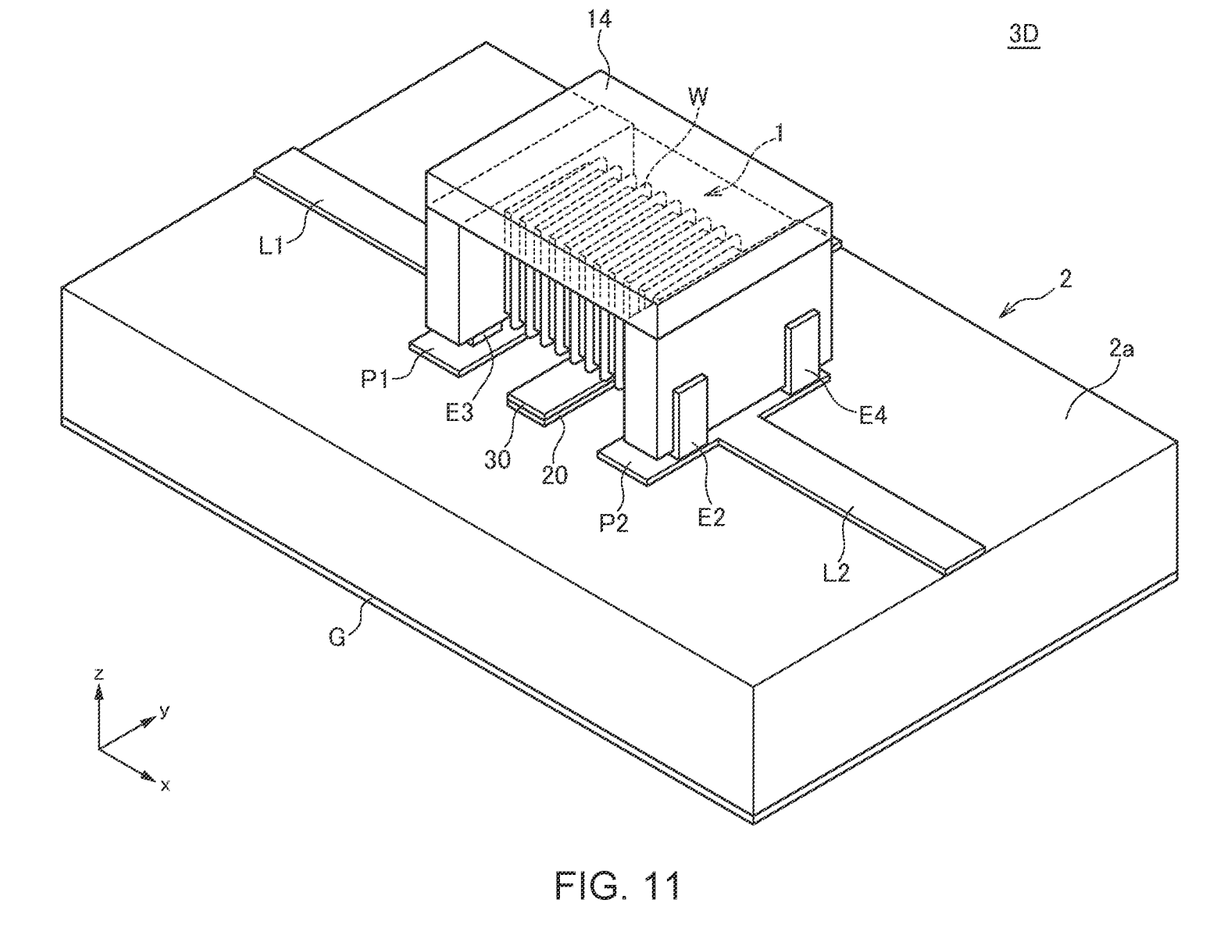
FIG. 11 is a schematic perspective view illustrating the outer appearance of a circuit board 3D according to a fourth embodiment.

FIG. 11 is a schematic perspective view illustrating the outer appearance of a circuit board 3D according to a fourth embodiment.

The circuit board 3D according to the fourth modification illustrated in FIG. 11 differs from the circuit board 3 according to the first embodiment in that a plate-like core 14 is additionally provided in the coil component 1. Other basic configurations are the same as those of the circuit board 3 according to the first embodiment, so the same reference numerals are given to the same elements, and overlapping description will be omitted.

The plate-like core 14 is fixed to the flange parts 11 and 12 and functions as a magnetic path connecting the flange parts 11 and 12. The material of the plate-like core 14 and the high permeability material of the drum-shaped core 10 are preferably the same. By thus additionally providing the plate-like core 14, a closed magnetic path is formed by the drum-shaped core 10 and plate-like core 14, making it possible to increase the inductance.

Second Embodiment

Figure 12:
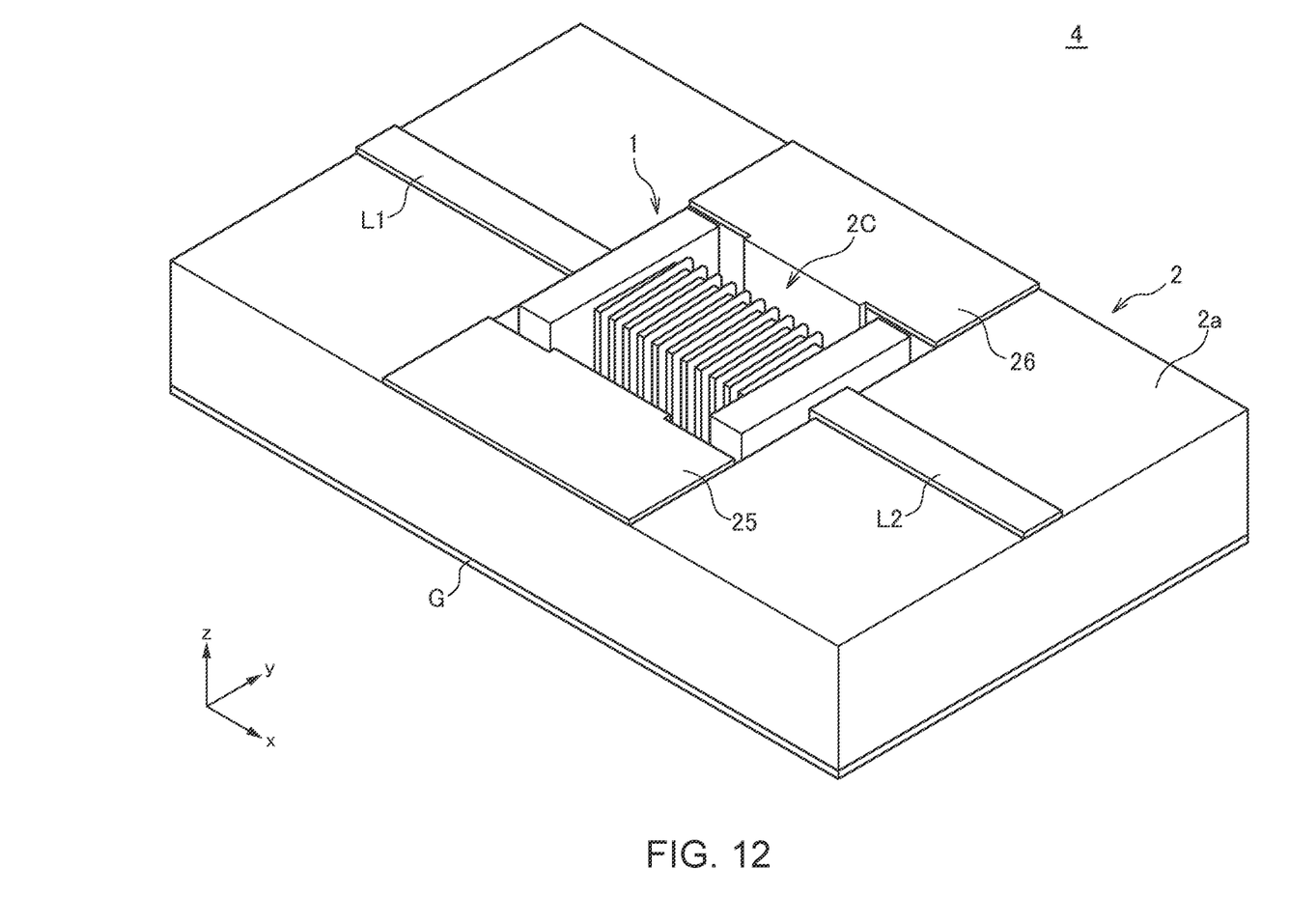
FIG. 12 is a schematic perspective view illustrating the outer appearance of a circuit board 4 according to a second embodiment of the present invention.
Figure 13:
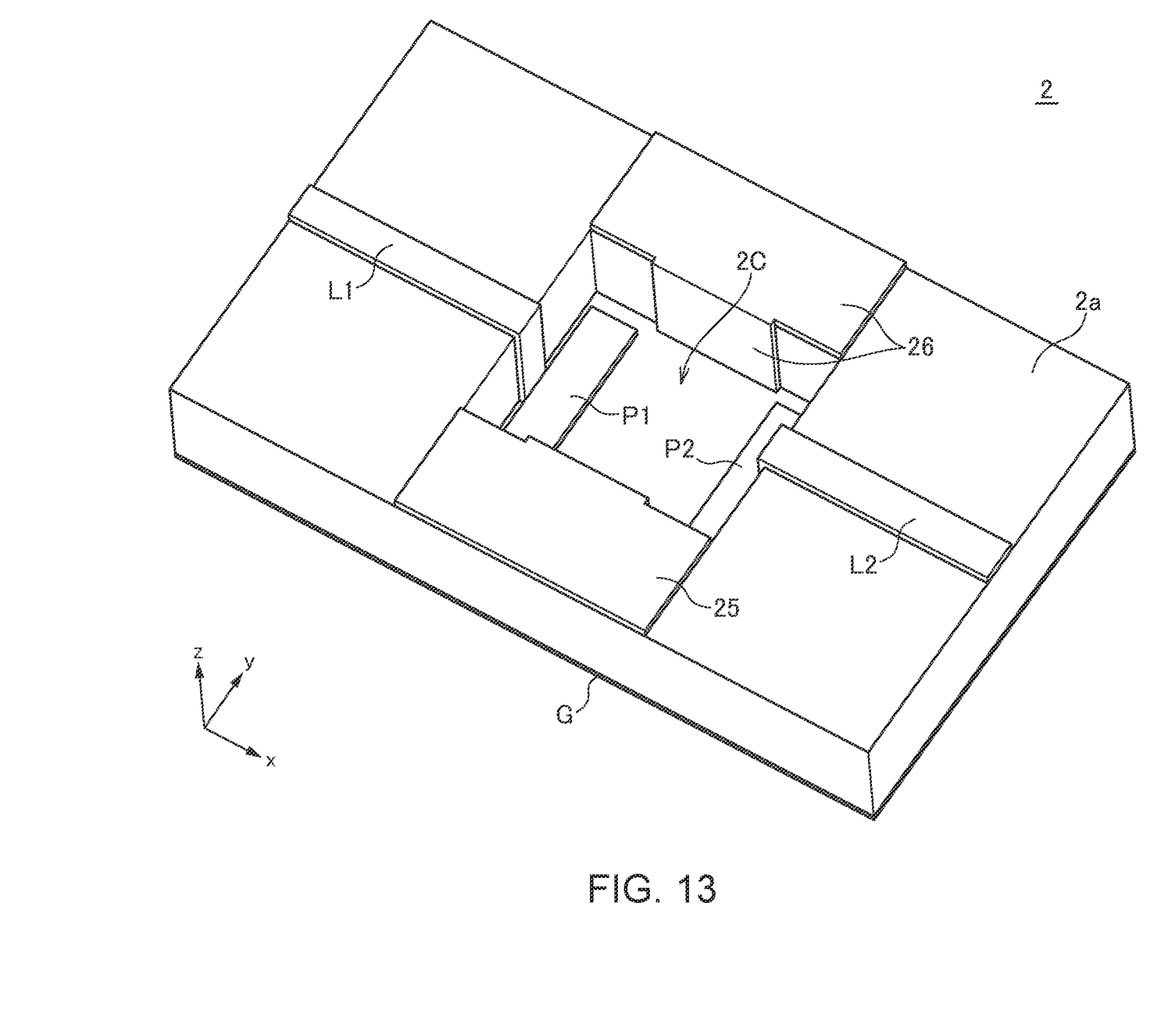
FIG. 13 is a schematic plan view illustrating the circuit board 4 from which the coil component 1 has been removed.

FIG. 12 is a schematic perspective view illustrating the outer appearance of a circuit board 4 according to a second embodiment of the present invention. FIG. 13 is a schematic plan view illustrating the circuit board 4 from which the coil component 1 has been removed.

As illustrated in FIGS. 12 and 13, the circuit board 4 according to the second embodiment differs from the circuit board 3 according to the first embodiment in that the substrate 2 has a cavity 2c, in which the coil component 1 is accommodated. The cavity 2c has land patterns P1 and P2 on its bottom surface and has capacitive electrodes 25 and 26 on its inner wall (xz plane). Other basic configurations are the same as those of the circuit board 3 according to the first embodiment, so the same reference numerals are given to the same elements, and overlapping description will be omitted.

In the present embodiment, when the coil component 1 is mounted in the cavity 2c, the capacitive electrodes 25, 26 are capacitively coupled to the wire W. This allows adjustment of the self-resonant frequency as in the first embodiment. In addition, since the capacitive electrodes 25 and 26 are provided on the inner wall of the cavity 2c, it is possible to add a larger capacitive component than that in the first embodiment and to eliminate the need to provide a member for supporting the capacitive electrodes 25 and 26. Further, since the coil component 1 is accommodated in the cavity 2c, the height of the circuit board 4 can be reduced. In this case, the entire coil component 1 need not be accommodated in the cavity 2c, and only a part thereof may be accommodated in the cavity 2c.

Figure 14:
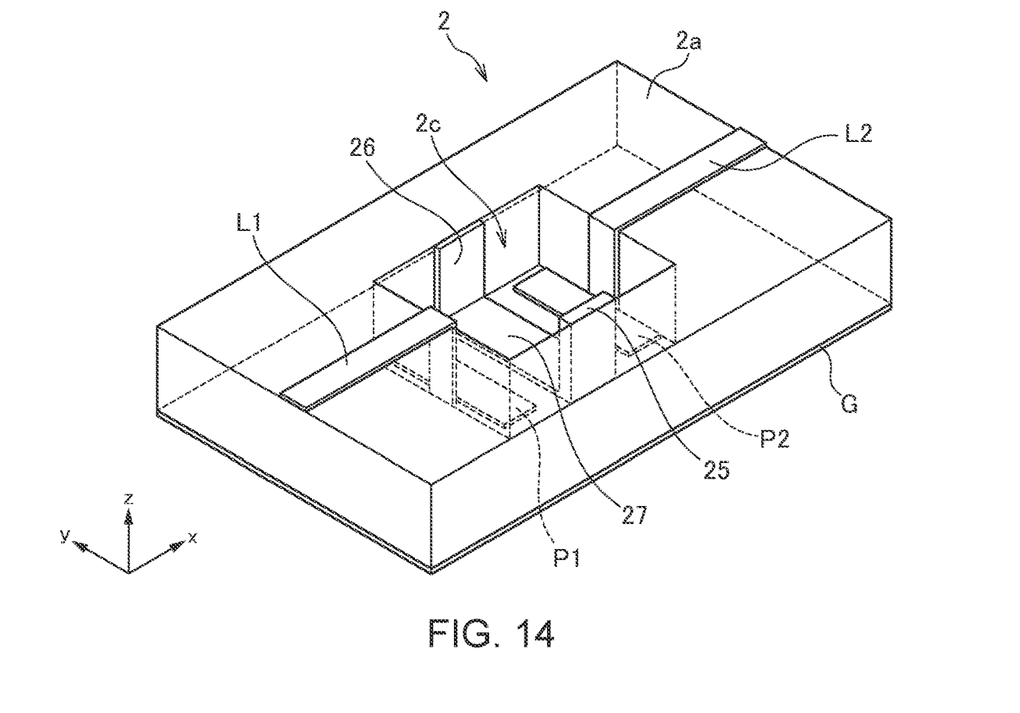
FIG. 14 is a schematic perspective view illustrating an example in which capacitive electrodes 25 to 27 are provided inside a cavity 2c.
Figure 15:
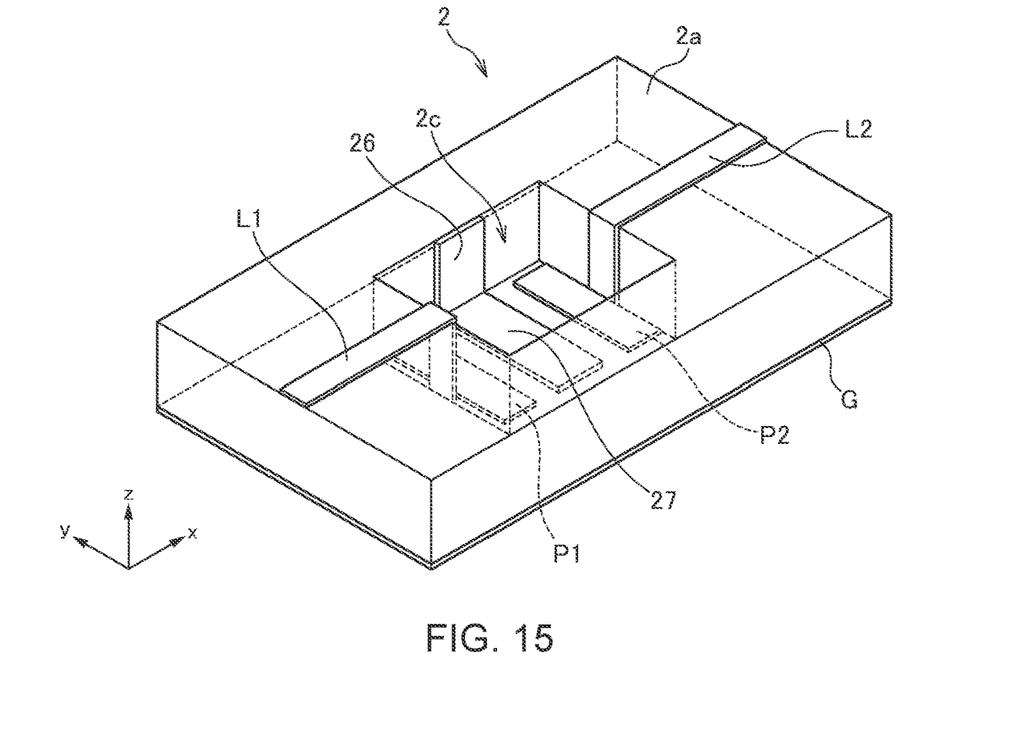
FIG. 15 is a schematic perspective view illustrating an example in which capacitive electrodes 26 and 27 are provided inside the cavity 2c.

In the substrate 2 illustrated in FIG. 13, the capacitive electrodes 25 and 26 are formed also on the surface 2a of the substrate 2; however, this is not essential in the present invention. Further, in the substrate 2 illustrated in FIG. 13, the capacitive electrodes 25 and 26 are provided on the inner wall (xz plane) of the cavity 2c; however, the position of the capacitive electrode is not particularly limited. For example, in addition to the capacitive electrodes 25 and 26, a capacitive electrode 27 may be provided on the bottom surface of the cavity 2c as in the example illustrated in FIG. 14, or the capacitive electrode 27 may be provided on the bottom surface of the cavity 2c in place, while omitting the capacitive electrode 25, as in the example illustrated in FIG. 15. Thus, the self-resonant frequency can be adjusted depending on the position or area of the capacitive electrode.

It is apparent that the present invention is not limited to the above embodiments, but may be modified and changed without departing from the scope and spirit of the invention.

What is claimed is:

1. A circuit board comprising:
   a substrate; and
   a coil component mounted on the substrate,
   wherein the coil component includes a core and a wire wound around the core,
   wherein the substrate includes a dielectric and a capacitive electrode capacitively coupled to the wire through the dielectric and supplied with a ground potential, and
   wherein the dielectric covers the capacitive electrode such that a space is provided between the wire and the dielectric, thereby a capacitive component between the wire and the capacitive electrode increases.

2. The circuit board as claimed in claim 1,
   wherein the core includes a winding core part wound with the wire, a first flange part positioned at one axial end of the winding core part, and a second flange part positioned at other axial end of the winding core part,
   wherein the coil component further include a first terminal electrode provided on the first flange part and connected to one end of the wire and a second terminal electrode provided on the second flange part and connected to other end of the wire,
   wherein the substrate further includes a first land pattern connected to the first terminal electrode and a second land pattern connected to the second terminal electrode, and
   wherein a height of the capacitive electrode is greater than a height of the first and second land patterns.

3. The circuit board as claimed in claim 1, wherein the capacitive electrode includes a first capacitive electrode covering the wire in a first direction and a second capacitive electrode covering the wire in a second direction different from the first direction.

4. The circuit board as claimed in claim 1, wherein a dielectric constant of the dielectric is greater than air.

5. A circuit board comprising:
   a substrate having a first land pattern, a second land pattern, a third land pattern arranged between the first and second land patterns, and a dielectric covering the third land pattern; and
   a coil component having:
     a core including a winding core part, a first flange part positioned at one axial end of the winding core part, and a second flange part positioned at other axial end of the winding core part;
     a wire wound around the winding core part;
     a first terminal electrode provided on the first flange part and connected to one end of the wire; and
     a second terminal electrode provided on the second flange part and connected to other end of the wire,
   wherein the coil component is mounted on the substrate such that the first and second terminal electrodes are connected respectively to the first and second land patterns, and that a part of the wire overlaps with the third land pattern via the dielectric, and
   wherein the dielectric covers the third land pattern such that a space is provided between the part of the wire and the dielectric, thereby a capacitive component between the part of the wire and the third land pattern increases.

6. The circuit board as claimed in claim 5,
   wherein the substrate further has an electrode pattern, and
   wherein another part of the wire overlaps with the electrode pattern.

7. The circuit board as claimed in claim 6, wherein the third land pattern and the electrode pattern are short-circuited.

8. The circuit board as claimed in claim 7, wherein the third land pattern and the electrode pattern are supplied with a fixed potential.

9. The circuit board as claimed in claim 5, wherein a dielectric constant of the dielectric is greater than air.

10. The circuit board as claimed in claim 5,
    wherein the coil component further has a third terminal electrode provided on the first flange part, and
    wherein the coil component is mounted on the substrate such that the first and third terminal electrodes are connected in common to the first land pattern.

11. The circuit board as claimed in claim 10,
    wherein the coil component further has a fourth terminal electrode provided on the second flange part, and
    wherein the coil component is mounted on the substrate such that the second and fourth terminal electrodes are connected in common to the second land pattern.

12. The circuit board as claimed in claim 5, wherein the substrate further has first, second, and third wiring patterns connected to the first, second, and third land patterns, respectively.

13. The circuit board as claimed in claim 12,
    wherein each of the first and second wiring patterns extends in a first direction, and
    wherein the third wiring pattern extends in a second direction different from the first direction.

14. The circuit board as claimed in claim 13, wherein the second direction is perpendicular to the first direction.

15. The circuit board as claimed in claim 5, wherein the third land pattern is smaller than each of the first and second land patterns.

16. The circuit board as claimed in claim 5, wherein a top surface of the third land pattern that faces the part of the wire is covered with the dielectric such that the top surface of the third land pattern is not exposed to an atmosphere.

* * * * *